United States Patent [19]

Allison

[11] 4,047,195
[45] Sept. 6, 1977

[54] SEMICONDUCTOR STRUCTURE

[75] Inventor: David F. Allison, Los Altos, Calif.

[73] Assignee: Scientific Micro Systems, Inc., Sunnyvale, Calif.

[21] Appl. No.: 615,465

[22] Filed: Sept. 22, 1975

Related U.S. Application Data

[63] Continuation of Ser. No. 414,764, Nov. 12, 1973, abandoned, and a continuation-in-part of Ser. No. 169,294, Aug. 5, 1971.

[51] Int. Cl.² ............ H01L 29/06; H01L 27/04; H01L 27/12; H01L 27/02
[52] U.S. Cl. .................................. 357/55; 357/43; 357/48; 357/49; 357/50
[58] Field of Search .............. 357/43, 48, 49, 50, 357/55

[56] References Cited

U.S. PATENT DOCUMENTS

| 3,386,865 | 6/1968 | Doo ................................. 357/50 |
| 3,623,218 | 11/1971 | Mitarai et al. ................... 357/50 |
| 3,659,160 | 4/1972 | Sloan et al. ..................... 357/50 |
| 3,755,001 | 8/1973 | Kooi et al. ....................... 357/50 |

*Primary Examiner*—Edward J. Wojciechowicz

*Attorney, Agent, or Firm*—Flehr, Hohbach, Test, Albritton & Herbert

[57] ABSTRACT

Semiconductor structure having a plurality of isolated islands in which semiconductor devices are formed and which are interconnected to form an integrated circuit. The islands are isolated from each other by a combination of dielectric isolation in the form of moats and regions of higher conductivity extending downwardly into the semiconductor body from the moats. The semiconductor body from which the semiconductor structure is formed has a surface with a <100> orientation. An etch resistant mask is formed on the surface. An anisotropic etch is utilized to provide a plurality of isolation moats extending downwardly from the surface and having inclined side walls oriented along a crystal plane different from the <100> plane and having bottom walls oriented along the <100> crystal plane of the semiconductor body. The side walls and the bottom walls of the moats are oxidized. The oxide on the bottom walls is then removed. Impurities are then caused to enter through the bottom walls to form regions of increased impurity concentration extending down from the bottom walls. Oxide is regrown on the bottom walls and the moats are filled. Devices forming parts of integrated circuits are formed in the islands. The devices are interconnected by leads extending over the moats.

7 Claims, 16 Drawing Figures

SEMICONDUCTOR STRUCTURE

CROSS REFERENCE TO RELATED APPLICATION

This is a continuation of application Ser. No. 414,764 filed Nov. 12, 1973, now abandoned.

This application is a continuation-in-part of application Ser. No. 169,294, filed Aug. 5, 1971.

BACKGROUND OF THE INVENTION

In the past the density of semiconductor devices in integrated circuits has been limited by the space required for adequate isolation between devices. For example, in conventional NPN bipolar transistor integrated circuits, isolation between adjacent N-type beds is usually achieved by providing P+ diffused regions in the N-type epitaxial layer extending from the surface down to the P-type substrate. The epitaxial N-type layer is usually on the order of three to four microns in thickness which means that the diffusion must be carried out through this depth. The width of these diffused regions is in the order of 6 to 8 microns. In forming devices in the N-type regions, P+ diffusions are carried out. However, these are much shallower than the P+ diffused regions extending down to the substrate and, therefore, must be carried out separately. Since these diffusions are separate operations, allowance must be made for alignment variations. In addition, if the P+ diffused regions are too close to the P-type base diffusions, space charge problems may be encountered. By way of example, in practice it has been found that in forming NPN bipolar transistors, a spacing of approximately 23 microns is required between the bases of adjacent transistors. In addition, it has been found that even where dielectric isolation is provided between N-type beds, there is some leakage between the beds. In MOS devices where dielectric isolation has been provided between islands, channel leakage occurs in N channel devices which is caused by normal inversion at the oxide interface and leakage under applied voltage occurs with respect to the metal leads utilized for interconnecting MOS devices. Also, in MOS devices there is a need for closer spacing. There is, therefore, a need for a new and improved semiconductor structure and method which will overcome the above named limitations.

SUMMARY OF THE INVENTION AND OBJECTS

The semiconductor structure comprises a plurality of islands of semiconductor material formed from a semiconductor body with semiconductor devices being formed in the isolated islands and being interconnected. The semiconductor islands are separated by dielectric isolation extending between the islands and below which there are provided regions having an impurity concentration greater than that of the semiconductor body.

In the method for producing the semiconductor structure, the isolation moats are formed by utilizing a semiconductor body having a surface with a <100> orientation and utilizing an anisotropic etch in conjunction with an etch resistant mask to form the isolation moats which extend downwardly from the top surface and having inclined side walls which are oriented along a crystal plane different from the <100> plane and having bottom walls which lie along the <100> plane. Thereafter, a layer of oxide insufficient to fill the moats is formed on the side walls and the bottom walls utilizing low temperature thermal oxidation so that the oxide forms at a faster rate on the side walls than on the bottom walls of the isolation moats whereby the resulting layer of oxide on the side walls is substantially thicker than the layer on the bottom walls. An etchant is utilized for removing the oxide from the bottom walls of the moats while still leaving an oxide layer on the side walls of the moats. An impurity is caused to enter through the exposed bottom walls of the isolation moats and down into the substrate to form isolation regions having an impurity concentration greater than that of the substrate. Oxide layers are then formed on the bottom walls of the moats which adjoin the oxide layers on the side walls of the moats to provide isolated islands of semiconductor material. Semiconductor devices are formed in the isolated islands. The moats are filled with a suitable insulating material. Leads extending over the moats are then provided for interconnecting the devices in the isolated islands.

In general, it is an object of the present invention to provide a semiconductor structure and method whereby the density of the semiconductor devices can be increased substantially.

Another object of the invention is to provide a semiconductor structure and method which is applicable to both bipolar and MOS technologies.

Another object of the invention is to provide a semiconductor structure and method of the above character in which substantially improved isolation is obtained between islands of semiconductor material.

Another object of the invention is to provide a semiconductor structure and method of the above character which prevents channeling in N-channel MOS devices.

Another object of the invention is to provide a semiconductor structure and method of the above character in which it is possible to form other regions of semiconductor devices with the same impurities which are being utilized for forming the regions of high impurity concentration for isolation purposes.

Additional objects and features of the invention will appear from the following description in which the preferred embodiments are set forth in detail in conjunction with the accompanying drawing.

DESCRIPTION OF THE PREFERRED EMBODIMENTS

Figure 1:
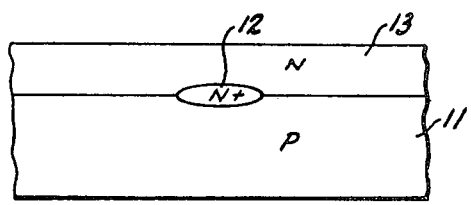
FIGS. 1 through 9 are cross-sectional views showing the steps utilized in the method for constructing a semiconductor structure incorporating the present invention and having the side walls of the moats lying in the <111> plane.

In performing the method for fabricating the semiconductor structure incorporating the present invention, a semiconductor body 11 of a suitable type such as silicon is provided having a surface with a <100> orientation. The semiconductor body 11 is doped throughout with an impurity of one conductivity type, such as a P-type impurity. A region 12 of opposite conductivity type often called a buried layer is formed by first growing an oxide layer or mask (not shown) on the surface of the semiconductor body 11, opening windows (not shown) in the mask and diffusing an N-type impurity therethrough to form the N-type regions 12 which will serve as a buried layer in the manner well known to those skilled in the art. An epitaxial layer 13 is then formed on the surface of the semiconductor body 11 by suitable epitaxial techniques well known to those skilled in the art. The N-type regions 12 grow upwardly into the epitaxial layer 13 as it is being formed, partly by diffusion and partially by outgassing in a manner well known to those skilled in the art. At the time that the epitaxial layer 13 is being grown, it also can be doped with an impurity and, as shown, can be doped with an impurity of opposite conductivity type, i.e., N-type as shown in FIG. 1. The N+ buried layer 12 is not essential to the structure and method of the present invention but is shown throughout the figures inasmuch as practical bipolar devices usually include an N+ buried layer for reasons well known to those skilled in the art. The epitaxial layer also will have a surface oriented along the <100> plane because it is formed on that surface of the semiconductor body 11.

Figure 2:
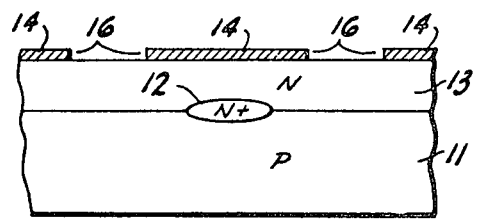

Thereafter, as shown in FIG. 2, a protective layer 14 is formed on the top surface of the epitaxial layer 13 and windows 16 are formed therein by conventional photolithographic and etching techniques. The windows 16 can have any suitable geometry such as, for example, square or circular and are positioned in such a manner that there is sufficient space between the windows to fabricate the devices which are to be utilized in the integrated circuit which is to be formed.

After the windows 16 have been formed in the protective silicon dioxide layer 14, isolation moats 17 are formed which have outwardly sloping side walls 17a and a planar bottom wall 17b. The moats 17 are etched to a depth preferably just below the epitaxial layer 13 into the semiconductor body although the specific depth of the moats is governed by the geometry of the semiconductor structure as will be more fully discussed hereinafter. In accordance with this invention, the moats 17 are etched using an anisotropic etch which, as is well known to those skilled in the art, selectively attacks the silicon wafer at differential rates along different crystal planes in order to provide pyramidal-shaped holes when square or rectangular geometry is utilized for the windows or cone-shaped holes where circular geometry is utilized for the windows. It should be appreciated that the size of the windows should be large enough so that the moats 17 will be etched to the desired depth without coming to an apex.

Figure 3:
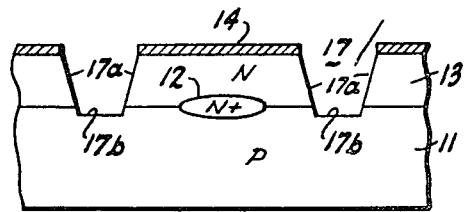

In accordance with a specific embodiment of this invention, when utilizing an epitaxial layer 13 of approximately 3 microns in thickness, it has been found suitable to form the windows 16 with a width of approximately 7 microns. The moats 17 are formed by an anisotropic etch to provide the sloping side walls 17a which are oriented in a crystal plane which is different from the <100> plane and, as shown in FIG. 3, are in the <111> crystal plane with the planar bottom walls 17 being oriented in the 100 crystal plane parallel to the surface of the epitaxial layer 13.

Figure 4:
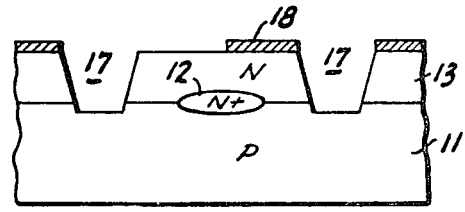

Subsequently, as shown in FIG. 4, a portion of the protective layer 14 overlying the epitaxial layer 13 between the moats 17 may be removed, leaving a portion of the protective layer identified as 18 which will thereafter serve as a mask as more fully discussed hereinafter.

Figure 5:
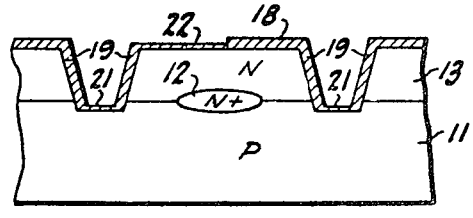

Then, as shown in FIG. 5, the structure of FIG. 4 is placed in an oxidizing atmosphere so that an insulating layer is formed on all the exposed surfaces of the semiconductor body including epitaxial layer 13 and also including the inclined side walls 17a and the bottom walls 17b of the isolation moats 17 and also on top of the N-type island as is shown in FIG. 4 from which the protective layer has been removed. In accordance with the present invention, when the oxidation is carried out at a relatively low temperature, it has been found that there is a differential growth rate of the oxide between the <100> plane and the other crystal planes. Thus, the insulating layers 19 formed on the side walls 17a of the isolation moats are substantially thicker than the insulating layer 21 formed on the bottom wall 17b of the moats 17 and the insulating layer 22 formed on the top surface of the epitaxial layer 13 from which the protective layer was previously removed. By relatively low temperatures, temperatures in the order of 900° C to 920° C are intended. It has been found that at higher temperatures in the order of 1200° C there is no appreciable difference in growth rates on the different planes, whereas at temperatures in the order of 920° C, it is relatively easy to achieve a thickness differential between the layers 19 and 21 in the order of 1000 A.

The windows 16 are positioned in such a manner so that the side walls 17a lie in the <111> plane. In addition, the windows 16 are sized in such a manner so that the etching can be carried out so it extends through the PN junction formed between the substrate 11 and the epitaxial layer 13 without the moat coming to an apex and still providing a bottom planar wall which also lies in the <100> plane parallel to the top surface of the epitaxial layer 13.

Figure 6:
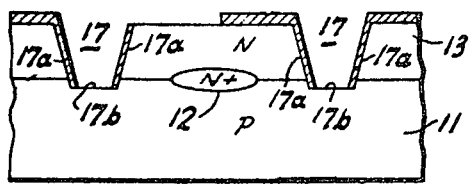

The structure shown in FIG. 5 is thereafter exposed to an etch which preferentially attacks the insulating material (i.e., silicon dioxide) which covers the surface of the epitaxial layer 13 and the moats 17. Preferably, a dilute etch is used so that the etching proceeds rather slowly. The structure of FIG. 5 is exposed to the etch for a time just sufficient to entirely remove the insulating layers 21 and 22 while still leaving portions of the insulating layers 19 adherent to the side walls 17a of the isolation moats 17. A structure such as shown in FIG. 6 is thus formed in which the isolation moats have insulating material still covering the side walls 17a but with all the insulating material removed from the bottom walls 17 and also from the top portions of the top surface of the epitaxial layer where the insulating layer 22 had previously been. Although in connection with the present method, the oxide from the bottoms of the moats and from the top surface of the epitaxial layer 13 have been removed simultaneously, it should be appreciated that, if desired, this can be accomplished in separate steps.

Figure 7:
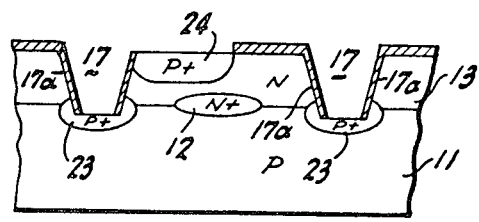

In the next step which is shown in FIG. 7, impurities are caused to enter through the surfaces which are not covered by the layer of protective material. This can be carried on in a number of ways. For example, this can be carried out solely by a predeposition step of the desired impurity as, for example, an impurity of the same conductivity type as the semiconductor body 11, that is P-type. Alternatively, this impurity can be deposited by use of ion implantation in a manner well known to those skilled in the art. After either the predeposition step or the ion implantation step, the impurity is driven more deeply into the semiconductor body to provide isolation regions 23 having an impurity concentration of the one conductivity type, P-type, which is greater than that of the substrate. It can be seen that the regions 23 are generally oval-shaped and extend downwardly through the PN junction formed between the P-type semiconductor body 11 and the N-type epitaxial layer 13 and also extend upwardly around the outsides of the side walls 17 in such a manner that the regions 23 encompass the lower extremities of the moats 17.

At the same time, dish-shaped P-type regions 24 are formed in the semiconductor islands which can serve as bases of transistors. It should be appreciated that although the diffusions 23 and 24 can be carried out simultaneously, it is also possible to carry out the steps for forming these regions independently if desired. It can be seen, however, that if it is desired to form them simultaneously that this is readily possible because they are driven to substantially the same depths as primarily dictated by the desired depth of the base regions 24. When the regions 23 and 24 are formed simultaneously, misalignment tolerances normally required between isolation and base diffusion steps can be eliminated to thereby make possible an increase in the density of the semiconductor devices which can be formed in a semiconductor body. Also, since the side walls 17a of the isolation moats serve as protective coatings or masks against diffusion, spreading of the diffusion laterally from the sides of the isolation moats is prevented. The critical factor is the spacing between the regions 23 and 24 with the acceptable distance therebetween being primarily governed by space charge effects surrounding the regions 23 and 24. The necessary extent of this spacing determines the minimum depth to which the isolation moats must extend. As previously mentioned, where a 3 micron epitaxial layer 13 is utilized, it has been found that the isolation moats 17 should extend downwardly approximately completely through the epitaxial layer 13 or slightly beyond. However, it should be appreciated that if desired, the moats can stop slightly short of the PN junction formed between the semiconductor body 11 and the layer 13 and thereafter the region 23 driven downwardly through the PN junction so that the desired isolation is obtained.

Figure 8:
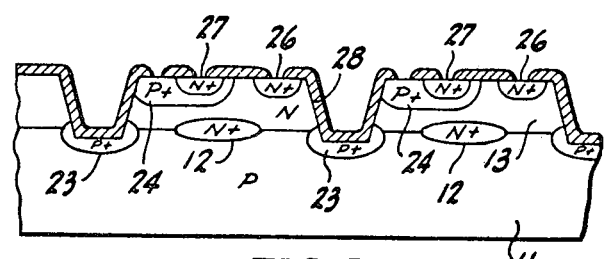
Figure 9:
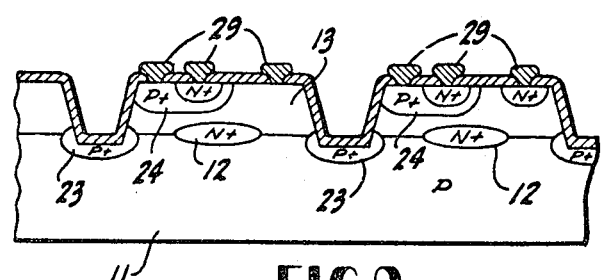

Thereafter, subsequent steps are performed on the structure shown in FIG. 7 for forming emitter and collector regions 26 and 27 by techniques well known to those skilled in the art. An insulating layer 28 is then formed on the surface as shown in FIG. 8. Openings thereafter are formed in the insulating layer for making contact to the base region 24, the emitter region 27 and the collector region 26. A portion of the completed structure is shown in FIG. 9 in which metallization generally indicated by reference numeral 29 has been added for interconnecting the various semiconductor devices which can be formed in a common substrate and for providing connection to external circuitry.

Thus, it can be seen that there has been provided a semiconductor structure in which much closer spacing can be achieved between isolated semiconductor devices. In addition, it has been possible to provide excellent isolation between the devices by the addition of regions of high impurity concentration extending downwardly from the isolation moats.

Figure 10:
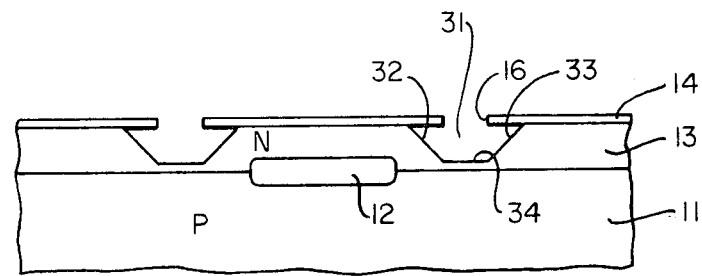
FIGS. 10 through 12 are cross-sectional views showing certain of the steps for another embodiment of the semiconductor structure incorporating the present invention in which the side walls of the moats lie in the <110> plane.
Figure 11:
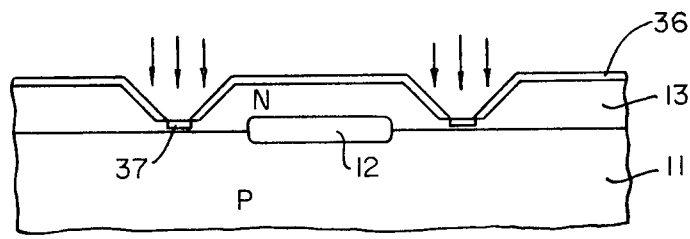
Figure 12:
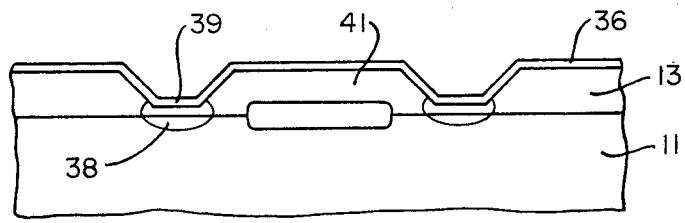

In connection with the present invention, it also has been found that there is a sufficient differential in growth rates between the $<100>$ plane and the $<110>$ plane, although less than between the $<100>$ plane and the $<111>$ plane, to utilize the present method. As shown in FIGS. 10–12, the steps utilized are very similar to those hereinbefore described in conjunction with the previous embodiment. However, in this case, the windows 16 are oriented in such a fashion that the anisotropic etch will cause etching to occur along the $<110>$ plane to provide moats 31 which are defined by inclined side walls 32 and 33 that are inclined at a 45° angle from the vertical and a bottom wall 34 which lies in the $<100>$ plane parallel to the top surface of the epitaxial layer 13. It will be noted that since etching is occurring along the $<110>$ plane on the side walls, there will be some undercutting of the protective layer 16 as shown in FIG. 10. It will be noted that in the embodiment shown in FIG. 10, the etching of the moats was arrested at a time when the bottom wall 34 was a slight distance above the PN junction formed between the semiconductor body 11 and the substrate 13. In order to compensate for the undercutting which occurs when the 110 plane is being used for the side walls, it is necessary to start with smaller windows 16 so that when the etching is completed, the moats have the desired dimensions.

In order to ensure that the side walls of the moats will be properly coated, it is desirable that the protective layer 14 be removed and a new insulating layer 36 formed on the top surface of the epitaxial layer 13 and on the side walls and the bottom wall of the moats 31. Again, as hereinbefore explained, there will be a preferential growth rate when low temperature oxidation is used as hereinbefore described so that the thickness of the protective layer 36 is thinner on the $<100>$ planes than it is on the $<110>$ planes. In order to prevent removal of the portions of the layer 36 lying on the top surface of the epitaxial layer 13, a suitable protective layer such as a layer of photoresist (not shown) can be provided on those portions of the layer 36 with the photoresist being removed from within the moats. A selective etch is then utilized for attacking the protective layer 36 within the moats. Since the thickness of the oxide or protective layer on the bottom wall 34 is substantially thinner than that on the side walls 32 and 33, the protective layer will first be removed from the bottom wall 34 to expose the same while there still remains a protective layer on the side walls in the manner hereinbefore described.

Impurities are caused to enter through the bottom walls 34 of the moats 31 by suitable means such as by the use of ion implantation to form regions 37 immediately below the bottom wall containing the impurity of the same conductivity type. Thereafter, the structure which is shown in FIG. 10 is placed in a furnace of a suitable type to thermally drive the impurities contained in the region 37 to a greater depth to form the enlarged regions 38 which have an impurity concentration therein which is of the same type but of a greater concentration than that in the semiconductor body 11. As can be seen, the regions 38 are generally oval-shaped and extend upwardly around the sides of the moats 31 as shown in FIG. 12. As the thermal drive-in is occurring, an oxide layer 39 is formed on the bottom walls 34 to cover the same and adjoins the insulating layer 36 formed on the side walls of the moats 31. Thus, there is provided a protective and insulating layer which includes the layers 39 and the layer 36 remaining on the side walls and on the top surfaces of the epitaxial layer 13 to form N-type islands which are dielectrically isolated from each other by the moats and the dielectric isolation in the moats and, in addition, by the regions of high impurity concentration extending downwardly from the moats into the semiconductor body and the PN junctions formed between the semiconductor body 11 and the islands 41 to isolate the islands from each other.

Figure 13:
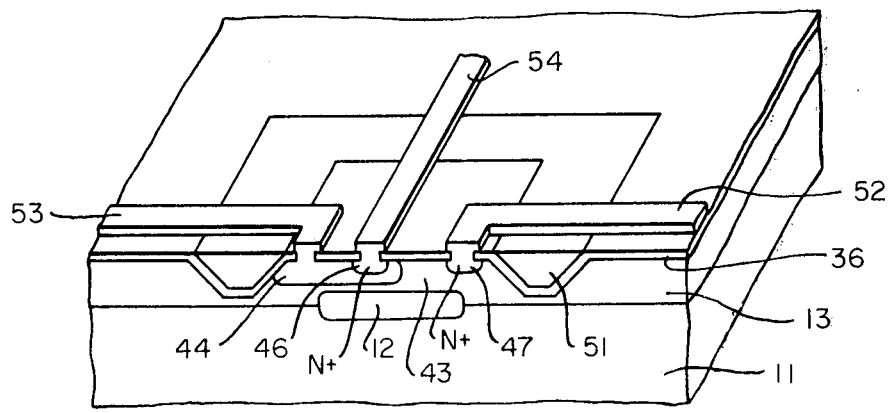
FIG. 13 is an isometric view, partially in cross-section, of a portion of a semiconductor structure incorporating the present invention.

Conventional semiconductor devices can then be formed in the islands 41. For example, as shown in FIG. 13, there can be provided one or more semiconductor devices on each island. In FIG. 13, a transistor 42 has been shown which includes the collector region 43, base region 44 and emitter region 46. These regions are formed in a manner well known to those skilled in the art and have dish-shaped PN junctions which extend to the surface with the base region 44 being formed within the collector region and the emitter region 46 being formed within the base region. A collector contact region 47 is also provided.

Either prior to or even after, if desired, the moats 31 are filled with a suitable material 51 such as polycrystalline silicon so that the top surface of the polycrystalline silicon is generally flush with the top surface of the protective layer 36. Openings are formed in the insulating layer 36, and metallization is deposited on the surface of the insulating layer 36 and the material 51 within the moats and the undesired material is removed by conventional photolithographic techniques so there remain leads 52, 53 and 54 making contact to the collector, base and emitter regions, respectively. As can be seen, the leads extend through the layer of insulating material to make contact to the regions. They are adherent to the layer of insulating material 36 and also are adherent to the polycrystalline material 51 so that interconnections can be readily made between the semiconductor devices of the different islands so that they all can be interconnected if desired to form a particular integrated circuit.

It can be seen that the method and semiconductor structure shown in FIGS. 10–13 has many of the same advantages of the previous embodiment, namely in that it permits closer spacing of the semiconductor devices and also provides improved isolation.

Figure 14:
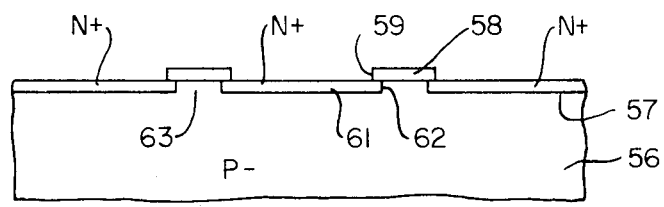
FIGS. 14 through 16 are cross-sectional views showing the steps utilized in a method for constructing a semiconductor structure of the MOS type incorporating the present invention.
Figure 15:
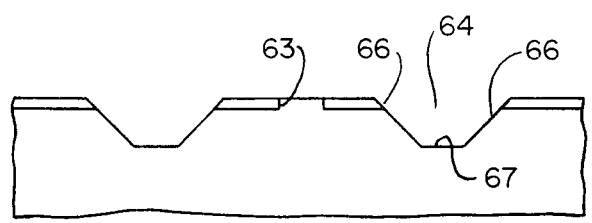
Figure 16:
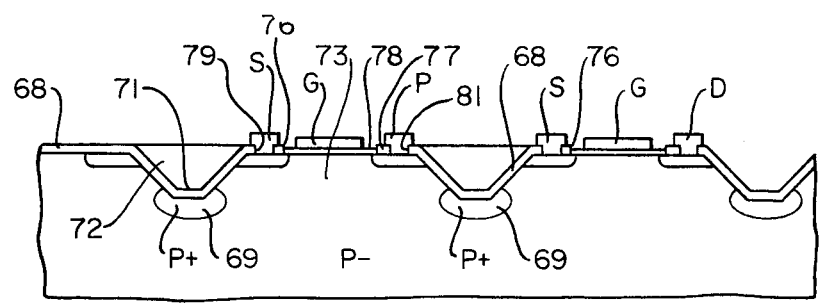

Still another embodiment of the invention is shown in FIGS. 14–16 showing that the method is also applicable for the fabrication of MOS type semiconductor devices. Thus, as shown in FIG. 14, there is provided a semiconductor body 56 of a P-type conductivity having an upper surface 57 having a <100> orientation. A protective layer 58 is formed on the surface 57 and windows 59 are formed therein to expose the surface 57 by the use of conventional photolithographic techniques. An impurity of opposite conductivity type, namely, an N+ impurity is caused to enter through the exposed surfaces 57 to provide N+ regions 61 defined by PN junctions 62 which are generally dish-shaped in cross-section and extend to the surface 57. It will be noted that the size of the portions of the insulating layer 58 which remain are relatively precise so that the spacing between the regions 61 is also relatively precise to provide channels having relatively precise dimensions therebetween.

Thereafter, the protective layer 58 is removed and a suitable etch resistant mask is formed on the surface 57 and an anisotropic etch is utilized to form moats 64 which extend through the N+ regions 61 and down into the semiconductor body 56. The moats 64 are defined by inclined side walls 66 which lie either in the <111> plane or the <110> plane depending upon the orientation of the windows through which the moats are formed and bottom walls 67 which lie in the <100> plane. It will be noted that the moats 64 are disposed between the channels 63 formed between the N+ regions 61.

Thereafter, a protective layer formed of a suitable material such as silicon dioxide is formed on the side walls 66 and the bottom walls 67 of the moat as well as the top surface 57 of the semiconductor body. Differential growth with respect to the thickness of the protective layer on the <100> plane and the other plane of the side walls occurs in the manner hereinbefore described. An etchant is utilized to remove the thinner oxide coating on the bottom walls and thereafter an impurity of the same conductivity type as the semiconductor body is caused to enter through the bottom walls 67 to form oval-like regions 69 extending downwardly from the moats and into the semiconductor body as shown. These regions have an impurity concentration substantially greater than that of the semiconductor body to form a channel stop. Oxide is again grown on the bottom walls 67 that adjoin the silicon dioxide layer 68 which has previously been formed on the side walls. The moats 64 are then filled with a suitable material 72 such as polycrystalline silicon. The polycrystalline material has a top surface which is generally flush with the top surface of the insulating layer 68. MOS devices can then be formed in the isolated islands 73 which have been formed in the semiconductor body 56. Thus, there has been provided windows 76 in which there has been provided a layer 77 of insulating material of a relatively precise thickness. In addition, there have been provided openings 79 and 81 in the insulating layer 68. Metallization is then deposited on the insulating layer 68 and on the layer 78 into the openings 79 and 81 and then the undesired metal is removed so that there remains source, gate and drain contacts as identified by the letters S, G and D in FIG. 16. The MOS devices can be interconnected by leads (not shown) which can extend over the material 72 provided in the moats 64.

Thus, it can be seen that in FIG. 16 there has been provided a plurality of N-channel devices in which the regions 69 serve as channel stops. In other words, they serve to prevent leakage which is caused by the normal inversion at the interface between the silicon dioxide insulating layer and the P-type semiconductor body. In a typical N-channel device, the P-type semiconductor body would have an impurity concentration of $1 \times 10^{15}$, whereas the impurity concentration in the channel stop regions 69 could range from $5 \times 10^{18}$ to $1 \times 10^{19}$.

Although the fabrication of N-channel devices has been shown in FIGS. 14–16, it should be appreciated that the invention is also applicable to P-channel devices in which the regions of higher impurity extending below the moats would serve to inhibit leakage under applied voltage with respect to the metal leads going across the polysilicon material filling the moats.

It is apparent from the foregoing that there has been provided a semiconductor structure and method in which it is possible to achieve greatly improved density of semiconductor devices in both bipolar and MOS devices. This can be accomplished with improved isolation between devices by providing regions of high impurity concentration extending below the isolation moats.

I claim:

1. In a semiconductor structure, a body of crystalline semiconductor material and having an upper surface lying in the 21 100> crystalline plane, isolation moats extending downwardly through said surface and being defined by side walls lying in a crystalline plane different from the <100> crystalline plane and having a bottom wall lying generally in the <100> crystalline plane to provide at said surface isolated islands, bipolar devices formed in the isolated islands, a layer of insulating material insufficient to fill the moats covering said side walls and said bottom walls of said moats regions of higher impurity concentration than that of the semiconductor body extending downwardly from the moats and into the semiconductor body, and a PN junction formed in the body of semiconductor material extending between the moats and below the bipolar devices, said regions extending through the PN junction and making contact with the side walls of the moats.

2. A semiconductor structure as in claim 1 together with MOS type devices formed in said isolated islands.

3. A semiconductor structure as in claim 1 wherein said side walls lie in the <111> crystalline plane.

4. A semiconductor structure as in claim 1 wherein said side walls lie in the <110> crystalline plane.

5. A semiconductor structure as in claim 1 together with an insulating material filling said moats so that said insulating material has a surface which is substantially flush with the surface of the semiconductor body, devices formed in the islands in the semiconductor body and lead means interconnecting the devices and extending over the moats and being adherent to the insulating material filling the moats.

6. A semiconductor structure as in claim 1 wherein said semiconductor body includes an epitaxial layer and wherein said moats in combination with said regions of greater impurity concentration extend through the epitaxial layer.

7. A semiconductor structure as in claim 1 wherein the layer of insulating material on the side walls forming the moats is substantially thicker than the layer of insulating material on the bottom walls of the moats.

* * * * *